United States Patent
Zbinden

(10) Patent No.: US 11,175,315 B2
(45) Date of Patent: Nov. 16, 2021

(54) CROSSARM INSULATOR PIN AUXILIARY MOUNTED PASSIVE ALL FIBER ELECTRO-OPTICAL CURRENT SENSOR

(71) Applicant: Adam Zbinden, Kirkland, WA (US)

(72) Inventor: Adam Zbinden, Kirkland, WA (US)

( * ) Notice: Subject to any disclaimer, the term of this patent is extended or adjusted under 35 U.S.C. 154(b) by 0 days.

(21) Appl. No.: 17/000,303

(22) Filed: Aug. 22, 2020

(65) Prior Publication Data

US 2021/0181429 A1    Jun. 17, 2021

Related U.S. Application Data

(60) Provisional application No. 62/948,287, filed on Dec. 15, 2019.

(51) Int. Cl.
*G01R 15/24* (2006.01)
*G02B 6/36* (2006.01)
*G01D 5/353* (2006.01)

(52) U.S. Cl.
CPC ........... *G01R 15/246* (2013.01); *G01R 15/24* (2013.01); *G01D 5/35374* (2013.01); *G02B 6/3616* (2013.01)

(58) Field of Classification Search
None
See application file for complete search history.

(56) References Cited

U.S. PATENT DOCUMENTS

| | | | | |
|---|---|---|---|---|
| 3,889,911 A | * | 6/1975 | Lindsey | H02G 1/04 248/228.1 |
| 4,894,608 A | * | 1/1990 | Ulmer, Jr. | G01R 15/246 324/96 |
| 4,894,609 A | * | 1/1990 | Fujiki | G01R 15/242 324/107 |
| 5,124,634 A | * | 6/1992 | Ulmer, Jr. | G01R 15/246 324/117 R |
| 5,677,622 A | * | 10/1997 | Clarke | G01R 15/246 324/96 |
| 6,140,810 A | * | 10/2000 | Bohnert | G01R 15/241 324/72 |
| 2007/0052971 A1 | * | 3/2007 | Bohnert | G01R 15/247 356/491 |
| 2016/0305984 A1 | * | 10/2016 | Bohnert | G01R 15/247 |

FOREIGN PATENT DOCUMENTS

JP    2000-111586 A  *  4/2000

* cited by examiner

*Primary Examiner* — Michael Stahl

(57) ABSTRACT

A device for installing an all fiber optoelectrical transducer on the base of a pin insulator column, such that the device mounts to the insulator pin column in a bushing style of concentric attachment and enables retrofits of said device to existing transmission & distribution bushing insulator equipment. A rigid and solid mechanical support region contains a hollow bushing attachment point at a center location, and radiates outward and bonds solidly and statically to a hollow toroidal conduit, which houses optical wave guides, terminating at auxiliary connection ports, located on the exterior of the hollow toroidal conduit region, while hollow conduit support arms extend from the exterior conduit ring to a power conductor region, and integrate with optical connection ports located on static support stands, where the optical ports interface with a detachable and flexible fiber loop transducer, which surrounds an energized power conductor.

1 Claim, 4 Drawing Sheets

CROSSARM INSULATOR PIN AUXILIARY MOUNTED PASSIVE ALL FIBER ELECTRO-OPTICAL CURRENT SENSOR

BACKGROUND OF THE INVENTION

Energized high voltage power lines and fiber optic waveguides have proven to function in proximity without interference, and this relationship is exploited in applications such as optical power ground wire (OPGW), where high-speed fiber optic conductors are embedded within overhead electric transmission wires and routed along the same conductor path.

For electrical power system supervisory control and data acquisition (SCADA), visibility and monitoring resolution are dependent on sensor distribution and range. Along high voltage distribution lines, increasing the resolution of line current monitoring can yield advantages.

Fiber optic current sensors measure using the Faraday Effect, which describes the rotation of linearly polarized light waves in the presence of an electromagnetic field, with the degree of rotation proportional to the magnitude of the proximate field. To measure current in a linear conductor, fiber current transducers (CTs) transmit linearly polarized light around the conductor in a loop, which provides a vector orientation between the electromagnetic field flux lines and the polarized light waves, such that a rotation of the light occurs. By measuring the initial rotation angle of polarized light and measuring its polar rotation after being guided around an electromagnetic field, the strength of the field can be calculated using algorithm-based microprocessor instruments.

SUMMARY OF THE INVENTION

The present invention provides a contained and complete solution for mounting a fiber optic loop current sensor on a distribution power line at the primary voltage level, by attaching to the base of the insulator support column mounted to the crossarm.

The fiber loop has long rigidly reinforced ends, to prevent stress of the fiber at the connection points. These rest on a support base and plug in to recessed weatherproof plugs. The fiber loop is contained within a waterproofed and flexibly armored jacket. These features prevent mechanical and environmental stress on the fiber loop.

The sensor stand contains internal fiber optic routing which connects the power line mounted fiber sensor loop to the base of the insulator support column, where transmit and receive ports link with auxiliary signal sources and sinks.

Pole mounted sensors connect passively to the main horizontal data link, which connects all sensor locations, with a bi-directional optical splitter, located within a pole-mounted patch panel. Bend-insensitive fiber can be routed vertically, through conduit, to the primary conductor crossarm, to plug in to a sensor at the base of the insulator support column.

An advantage of the device is that it requires no active power to operate, as all signal power is provided from the high-speed horizontal backbone using the passive optical signal network architecture.

DETAILED DESCRIPTION OF THE INVENTION

Figure 1:
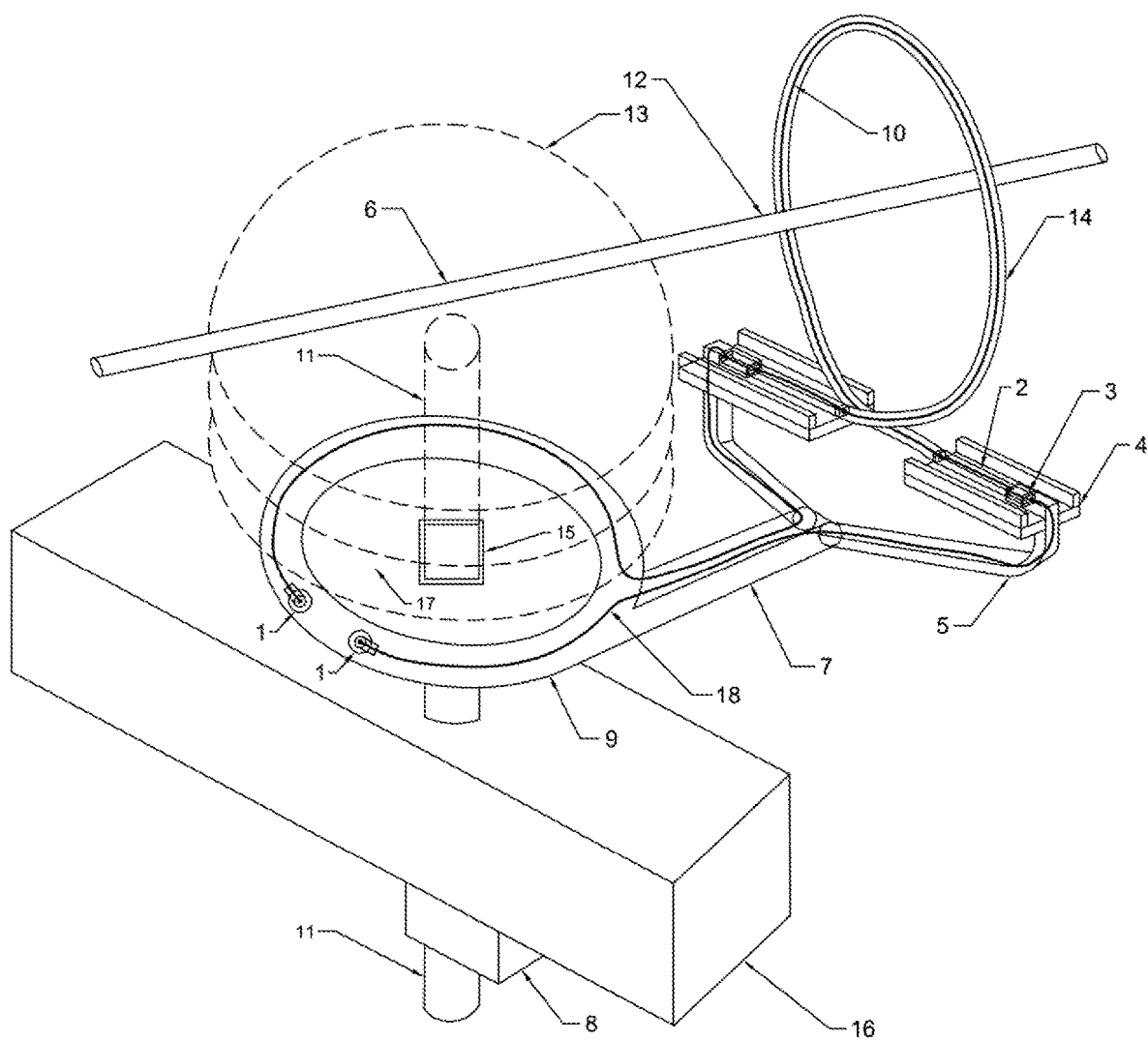
FIG. 1 is a complete depiction of the present invention. The fiber sensor loop is shown with 10, encircling an electrical conductor shown with 12 which rests on an insulator support 13 at a location shown with 6, inside of a weather-proof flexibly armored jacket shown with 14. The fiber loop shown with 10, 14 has extending and rigid end-reinforcing connector sleeves, shown with 2, which rest on the sensor support stands shown with 4 and plug in to the recessed fiber optic sensor loop connection ports, shown with 3. The fiber loop comprised of 10, 14, 2 continues via 18 through the internal routing of the extending fiber loop support arm shown with 5,7. The entire fiber loop support arm extension comprised of 4,5,7 is statically connected to the toroidal sensor base shown with 9, which mounts through the center 15 to the insulator support column shown with 11 via a structural support region 17, where 11 is supported by cross-arm mounting hardware shown with 8. The toroidal sensor base 9 has internal routing around its hollow perimeter for the continuation of the fiber loop 10 to the auxiliary/external transmit and receive ports shown with 1 via internal optical circuits 18. The TX/RX ports 1 are for external conduit-routed fiber connections from the SCADA monitoring center and comprise a complete loop around the power conductor 12.
Figure 2:
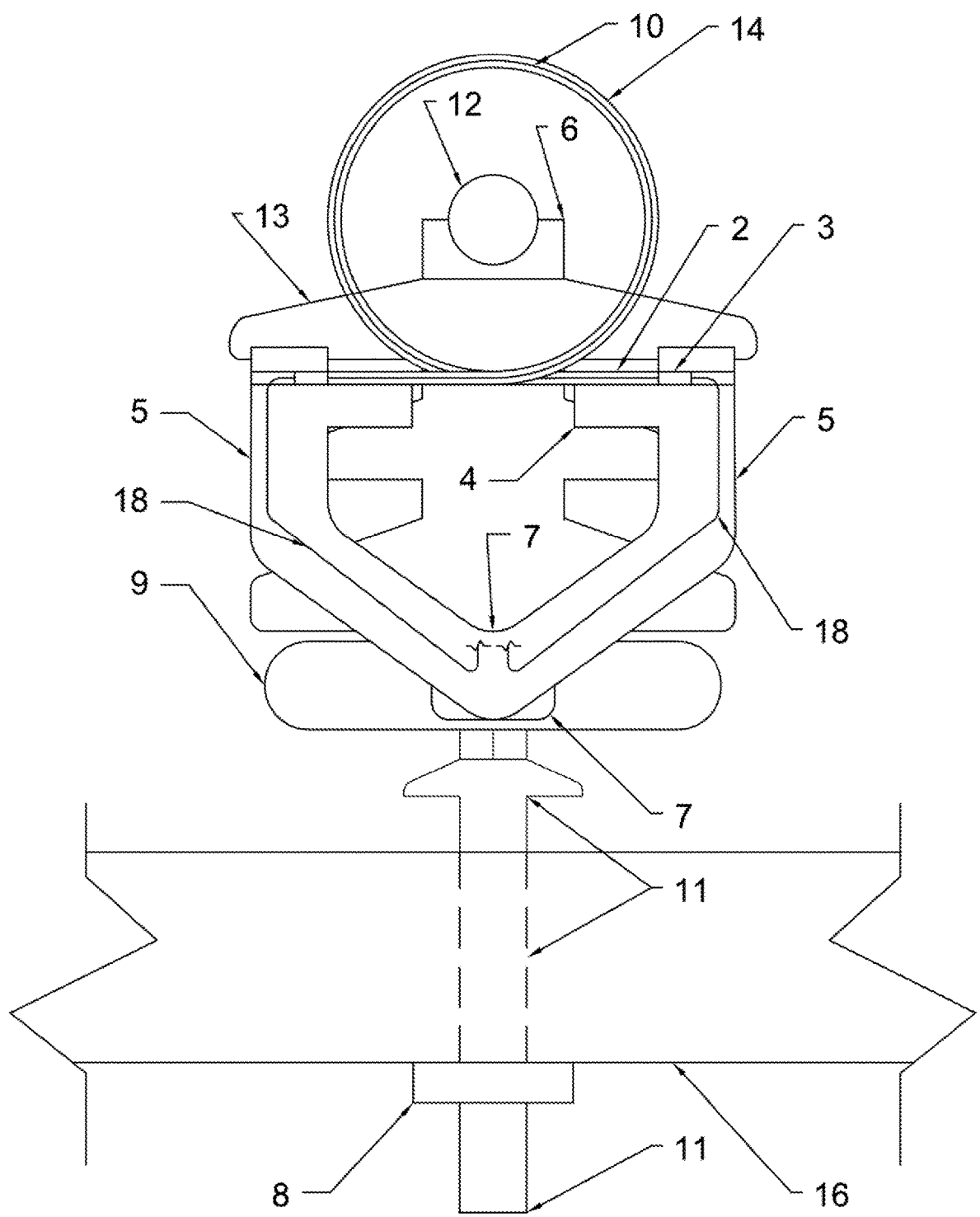
FIG. 2 is a front view of the present invention, as viewed from a perspective which is collinear with a power line conductor.
Figure 3:
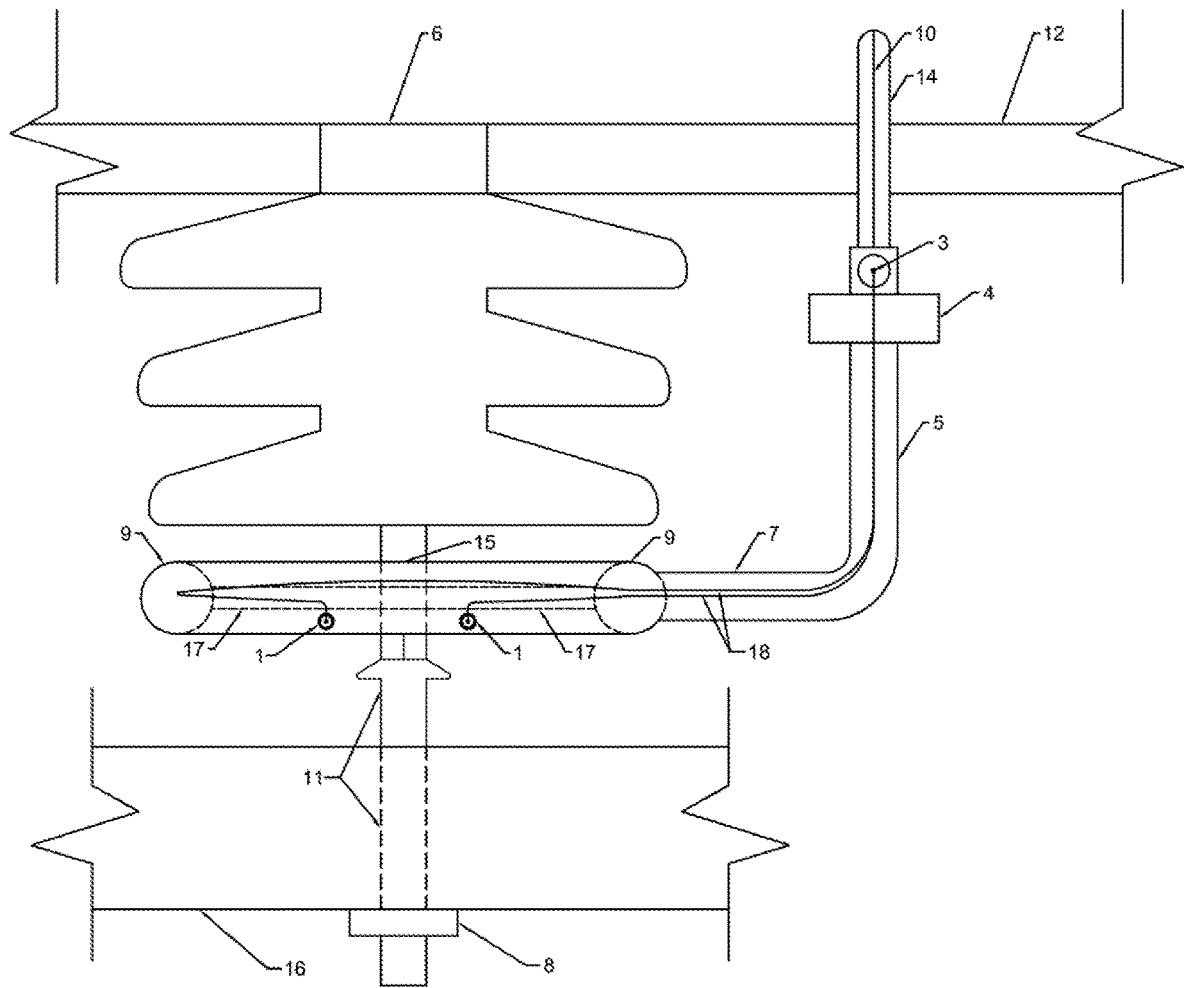
FIG. 3 is a profile depiction of the present invention.
Figure 4:
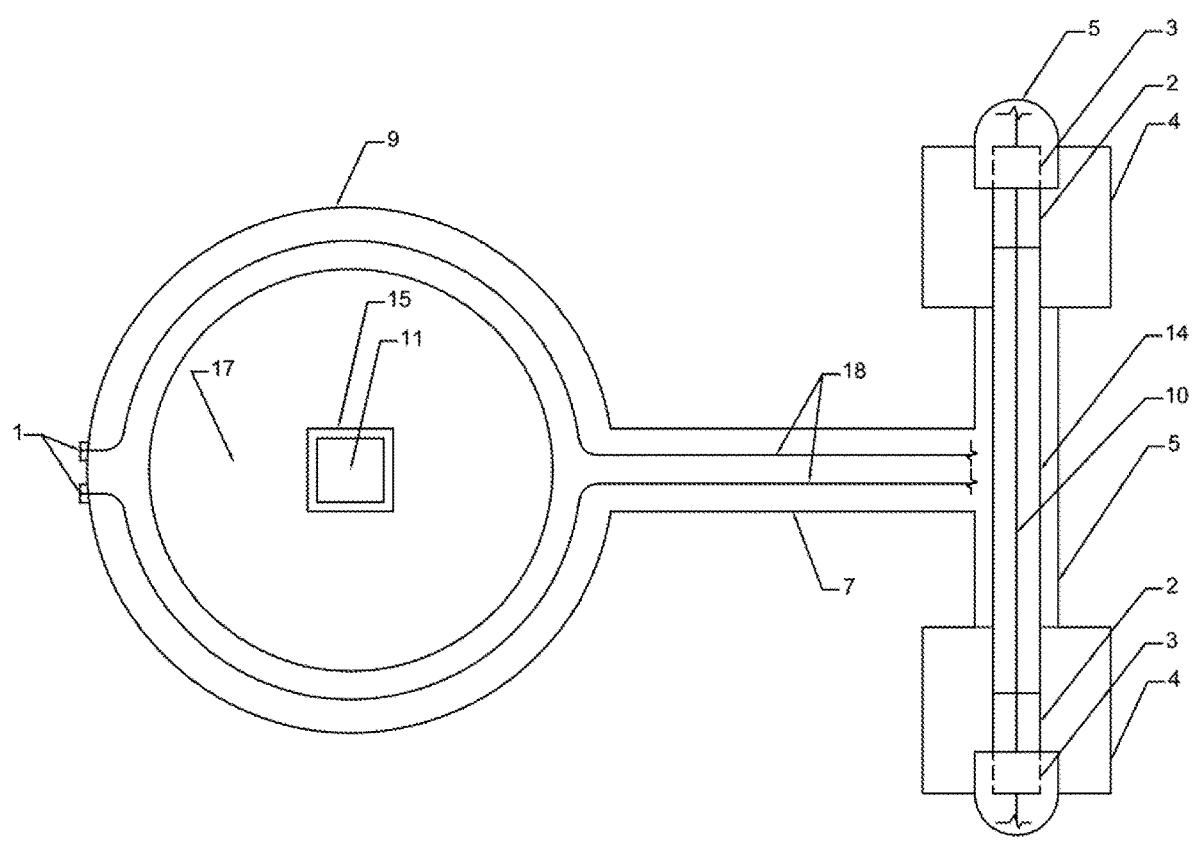
FIG. 4 is a top view of the present invention.

The center 15 of the sensor base 9 connects to the insulator support column 11, which is mounted to the crossarm 16, via a structural support region 17, and is located beneath a pin insulator 13 which supports a power line conductor 12 at a location shown with 6.

The sensor base comprised of 9, 15, 17 and the fiber sensor support arm extensions comprised of 4,5,7 are mounted to the insulator support column comprised of 8, 11 which is mounted to the crossarm 16. The fiber sensor transducer loop comprised of 2, 10,14 is connected to the rest of the device at the recessed, weatherproof connectorized attachment ports 3 which are located on the sensor support stands 4. After plugging in to 3, the fiber loop sensor 2, 10, 14 continues internally through the device via the internal optical circuits 18, to the auxiliary signal transmit and receive ports 1, located on the sensor base 9.

The invention claimed is:
1. An optical current sensor, including:
a conduit assembly including:
a ring portion which is configured to surround an insulator support column mounted to a crossarm of a utility pole,
an arm portion having a proximal end connected to said ring portion and a distal end remote from said ring portion, said arm portion including a pair of branches at the distal end, and
a pair of optical circuits, wherein a part of each optical circuit is routed within said ring portion and a part of each optical circuit is routed within said arm portion, wherein said ring portion includes at an accessible location on an exterior thereof a pair of optical connection ports, each optical connection port terminating a first end of a respective one of said optical circuits;
an optical fiber transducer cable assembly, including:

a transducer cable including a waterproof and armored cable jacket and an optical fiber within said cable jacket, and a pair of transducer cable ends, each transducer cable end including a reinforcement attachment and an optical port connector, wherein each optical port connector terminates an end of said optical fiber; and a pair of transducer support platforms, each transducer support platform including:

an optical connection port which terminates a second end of a respective one of said optical circuits, and which is configured to be optically coupled with a respective optical port connector of said optical fiber transducer cable assembly, wherein each transducer support platform is connected to a respective one of said branches of said arm portion;

wherein when a complete loop of said transducer cable is installed around a power line conductor, said optical connection ports are positioned below a center of said power line conductor by a distance equal to a radius of said complete loop.

\* \* \* \* \*